(12) United States Patent  
Kohda et al.

(10) Patent No.: US 8,618,722 B2  
(45) Date of Patent: Dec. 31, 2013

(54) PIEZOELECTRIC RESONATOR PLATE AND MANUFACTURING METHOD FOR PIEZOELECTRIC RESONATOR PLATE

(75) Inventors: Naoki Kohda, Kakogawa (JP); Syunsuke Satoh, Kakogawa (JP); Hiroki Yoshioka, Kakogawa (JP)

(73) Assignee: Daishinku Corporation, Kakogawa-shi ( * ) Notice: Subject to any disclaimer, the term of this patent is extended or adjusted under 35 U.S.C. 154(b) by 0 days.

(21) Appl. No.: 13/203,287

(22) PCT Filed: Sep. 15, 2010

(86) PCT No.: PCT/JP2010/065973  
§ 371 (c)(1),  
(2), (4) Date: Aug. 25, 2011

(87) PCT Pub. No.: WO2011/034104  
PCT Pub. Date: Mar. 24, 2011

(65) Prior Publication Data  
US 2012/0187805 A1  Jul. 26, 2012

(30) Foreign Application Priority Data  
Sep. 18, 2009  (JP) ................................. 2009-217049

(51) Int. Cl.  
*H01L 41/08*  (2006.01)

(52) U.S. Cl.  
USPC ........................................ 310/348; 310/344

(58) Field of Classification Search  
USPC ........................................ 310/320, 367, 368  
See application file for complete search history.

(56) References Cited

U.S. PATENT DOCUMENTS

| | | | | |
|---|---|---|---|---|
| 3,906,260 A | * | 9/1975 | Oguchi | 310/346 |
| 5,218,328 A | * | 6/1993 | Morita et al. | 333/187 |
| 5,235,240 A | * | 8/1993 | Morita et al. | 310/365 |
| 5,307,034 A | * | 4/1994 | Morita et al. | 333/187 |
| 6,518,688 B1 | * | 2/2003 | Sasaki | 310/320 |
| 6,750,593 B2 | * | 6/2004 | Iwata | 310/321 |
| 2004/0036380 A1 | * | 2/2004 | Oda et al. | 310/311 |
| 2009/0167117 A1 | * | 7/2009 | Yasuike | 310/361 |
| 2009/0267460 A1 | * | 10/2009 | Satoh et al. | 310/365 |
| 2010/0213794 A1 | * | 8/2010 | Ishihara et al. | 310/348 |

FOREIGN PATENT DOCUMENTS

| | | |
|---|---|---|
| JP | 2000-040935 | 2/2000 |
| JP | 2000-278080 A | 10/2000 |
| JP | 2002-033640 A | 1/2002 |
| JP | 2002-246869 A | 8/2002 |
| JP | 2004-088138 A | 3/2004 |
| JP | 2007-184965 A | 7/2007 |
| JP | 2009-164824 A | 7/2009 |
| WO | WO 2007/017992 A1 | 2/2007 |
| WO | WO 2007/072668 A1 | 6/2007 |

* cited by examiner

*Primary Examiner* — Mark Budd  
(74) *Attorney, Agent, or Firm* — Marvin A. Motsenbocker; Mots Law, PLLC (57) ABSTRACT

In a piezoelectric resonator plate, a substrate having a main face formed in a rectangular shape is provided with a vibration portion and a joining portion that are integrated with each other, the vibration portion including a vibration region configured by forming a pair of excitation electrodes, and the joining portion having formed therein a pair of terminal electrodes that is joined to an external portion. The terminal electrodes in the pair each have a conductive bump formed therein and are electrically connected respectively to the excitation electrodes in the pair. Also, the substrate includes a post portion formed convexly at a position where the pair of terminal electrodes is formed.

14 Claims, 9 Drawing Sheets

PIEZOELECTRIC RESONATOR PLATE AND MANUFACTURING METHOD FOR PIEZOELECTRIC RESONATOR PLATE

TECHNICAL FIELD

The present invention relates to a piezoelectric resonator plate and a manufacturing method for a piezoelectric resonator plate.

BACKGROUND ART

Examples of piezoelectric resonators currently used include crystal oscillators and crystal resonators. With this type of piezoelectric resonator, the casing is made up of a rectangular parallelepiped package. This package is constituted by a base and a lid, and a piezoelectric resonator plate is held on and joined to the base with a conductive adhesive made of a flowable material in the interior of the package. The piezoelectric resonator plate is hermetically sealed in the interior of the package by joining the base and the lid (see Patent Document below, for example).

With the technique of Patent Document 1 below, the piezoelectric resonator plate is joined to the base with a conductive adhesive. At the time of this joining, external stress from the conductive adhesive (joint stress occurring in the case of joining the piezoelectric resonator plate to the base) is directly applied to the piezoelectric resonator plate and adversely affects the characteristics of the piezoelectric resonator plate (such as frequency).

Also, with the technique of Patent Document 1 below, electrodes of different polarities are arranged on the base and each is coated with a conductive adhesive, and using this conductive adhesive, the piezoelectric resonator plate is joined to the base. This conductive adhesive is made of a flowable material and thus spreads (flows) over the substrate when applied on the electrodes or when used for joining the piezoelectric resonator plate to the base, thereby causing a short between the electrodes of different polarities.

PRIOR ART DOCUMENT

Patent Document

[Patent Document 1] JP2005-191709A

SUMMARY OF INVENTION

Problem to be Solved by the Invention

For this reason, instead of the aforementioned conductive adhesive, conductive bumps made of a non-flowable material, such as metal bumps, are currently used to join the piezoelectric resonator plate to the base.

Meanwhile, in the case of bump bonding using conductive bumps (e.g., ultrasonic welding of conductive bumps), the conductive bumps need some height. However, the increased height of the conductive bumps causes variations in the height dimension and shape of the bumps and makes it impossible to provide the piezoelectric resonator plate with bumps of a desired shape. In addition, such variations in the height dimension and shape of the bumps cause the installation of the piezoelectric resonator plate on the base to be unstable.

In view of this, in order to solve the above-described problem, it is an object of the present invention to provide a piezoelectric resonator plate and a manufacturing method for a piezoelectric resonator plate that suppress variations in the height dimension and shape of bumps.

Means for Solving the Problems

In order to achieve the above-described object, in the piezoelectric resonator plate according to the present invention, a vibration portion and a joining portion are integrally provided in a substrate having a main face formed in a rectangular shape, the vibration portion including a vibration region configured by forming a pair of excitation electrodes, the joining portion having formed therein a pair of terminal electrodes that is joined to an external portion, the terminal electrodes in the pair each having a conductive bump formed therein and being electrically connected respectively to the excitation electrodes in the pair, and the substrate including a post portion formed convexly at a position where the pair of terminal electrodes is formed.

According to the present invention, the vibration portion and the joining portion are provided in the substrate, the terminal electrodes in the pair each have a conductive bump formed therein and are electrically connected respectively to the excitation electrodes in the pair, and the substrate includes a post portion formed convexly at a position where the pair of terminal electrodes is formed. Therefore, the height of the conductive bumps for joining with the external portion can be reduced even in the case of bump bonding (e.g., ultrasonic welding of the conductive bumps), and accordingly variations in the height dimension and shape of the bumps, which may occur due to the increased height of the bumps, can be suppressed. In particular, the surface of the pair of terminal electrodes can be flattened. As a result, it is possible to stabilize the joining (installation) of the piezoelectric resonator plate to the external portion. In addition, the formation of the post portion makes it possible to suppress the height of the bumps and accordingly reduce the volume of the bumps, thereby suppressing the manufacturing cost.

In the above configuration, the conductive bump may be formed on the inner side of the pair of terminal electrodes.

In this case, because the conductive bump is formed on the inner side of the pair of terminal electrodes, protrusion of the conductive bump outside the pair of terminal electrodes can be suppressed.

In the above configuration, the thickness of the post portion at the pair of terminal electrodes may be at least three times the thickness of other portions.

In this case, because the thickness of the post portion at the pair of terminal electrodes is at least three times the thickness of other portions, it is preferable for flattening the surface of the pair of terminal electrodes. If the thickness of the post portion is less than three times the thickness of other portions, the conductive bump needs to be thickened (heightened), and in this case, the flatness of the surface of the pair of terminal electrodes is reduced.

In the above configuration, a wall of the post portion may have a tapered face.

In this case, because the wall of the post portion has a tapered face, the strength of the post portion can be increased. In addition, since the edge of the post portion is eliminated, a disconnection of the pair of terminal electrodes in the post portion can be suppressed.

In the above configuration, the surface of the pair of terminal electrodes may be formed using a Cr—Au film.

In this case, the film can be formed even on the side face of the pair of terminal electrodes, and therefore the entire surface and side face of the pair of terminal electrodes can be covered with the Cr—Au film. This will bring about an anchor effect in portions where the film has been formed.

In the above configuration, a blocking means for, in the case where the pair of terminal electrodes is joined to the external portion via the conductive bump, blocking spread of joint stress occurring in the substrate to the vibration region may be provided between the vibration portion and the joining portion.

In this case, because the blocking means for, in the case where the pair of terminal electrodes is joined to the external portion via the conductive bump, blocking spread of joint stress occurring in the substrate to the vibration region is provided between the vibration portion and the joining portion, the spread of the joint stress occurring in the substrate during joining to the vibration region can be suppressed even if the piezoelectric resonator plate is joined to the external portion (in the present embodiment, the base) via the conductive bumps that develop high joint stress. As a result, it is possible to increase the joint strength without affecting the vibrations (oscillation frequency) of the piezoelectric resonator plate.

In the above configuration, one terminal electrode of the pair of terminal electrodes may be formed on one of both end edge portions of the joining portion, the blocking means may be configured by a cut-out portion that is formed toward one side from the other side of both end sides of the substrate, and the vibration portion and the joining portion may be integrally formed in only the vicinity of the one edge portion of the joining portion where the one terminal electrode is formed.

In this case, because one terminal electrode is formed on one edge portion of the joining portion, the blocking means is configured by a cut-out portion formed toward one side from the other side of the substrate, and the vibration portion and the joining portion are integrally formed in only the vicinity of the one edge portion of the joining portion where the one terminal electrode is formed, the cut-out portion enables the joint stress occurring in the substrate during joining to be confined within the joining portion and thereby makes it possible to suppress the spread of the joint stress to the vibration region.

In the above configuration, the terminal electrodes in the pair may be formed respectively on both edge portions of the joining portion at the both end sides of the substrate, and the blocking means may be configured by two cut-out portions that are formed inward respectively from both of the sides of the substrate, and a through hole that is formed between the two cut-out portions.

In this case, because the terminal electrodes in the pair are formed respectively on both edge portions of the joining portion at the both end sides of the substrate, and the blocking means is configured by two cut-out portions formed inward respectively from both of the sides of the substrate and a through hole formed between the two cut-out portions, the cut-out portions and the through hole enable the joint stress occurring in the substrate during joining to be confined within the joining portion and thereby make it possible to suppress the spread of the joint stress occurring in the substrate to the vibration region. Specifically, in the presence of the two cut-out portions, although the joint stress concentrates between the two cut-out portions, the through hole prevents this concentrated joint stress from propagating into the vibration region and enables the joint stress to be confined within the joining portion.

In the above configuration, the terminal electrodes in the pair may be formed on one of both end edge portions of the joining portion at one of both end sides of the substrate, and the excitation electrodes may be located in a position other than on a virtual orthogonal line that is orthogonal to a virtual line that connects the pair of terminal electrodes.

In this case, because the terminal electrodes in the pair are formed on one of both end edge portions of the joining portion at one of both end sides of the substrate, and the excitation electrodes are located in a position other than on a virtual orthogonal line orthogonal to a virtual line connecting the pair of terminal electrodes, even if the piezoelectric resonator plate is joined to the external portion (in the present embodiment, the base) via the conductive bumps that develop high joint stress, the spread of joint stress occurring in the substrate during joining to the vibration region can be suppressed because the joint stress occurs in a direction different from that toward the vibration region. As a result, the joint strength can be increased without affecting the vibrations (oscillation frequency) of the piezoelectric resonator plate.

In the above configuration, the terminal electrodes in the pair may be provided in alignment with each other such that one of the terminal electrodes is further from the vibration portion than the other terminal electrode.

In this case, a configuration is possible in which the spread of stress occurring between the conductive bumps at the terminal electrodes in the pair (input and output) can be stopped on the conductive bump side that is closer to the vibration region, and as a result, the vibration region is not affected by the stress occurring between the conductive bumps.

In the above configuration, of the pair of terminal electrodes, the terminal electrode that is further from the vibration portion on the substrate may be larger than the terminal electrode that is closer to the vibration portion on the substrate.

In this case, because the terminal electrode that is further from the vibration portion on the substrate is larger than the terminal electrode that is closer to the vibration portion on the substrate, the electrical connection of the pair of terminal electrodes to the external portion can be established with stability, while increasing the strength of joining to the external portion at the terminal electrode that is further from the vibration portion.

In the above configuration, the conductive bump may be a plating bump.

In this case, because the conductive bump is a plating bump, the conductive bump does not spread (flow) during its joining to the external portion, and accordingly a short between the electrodes can be suppressed. In addition, the conductive bump, which is a plating bump, can increase the joint strength.

Furthermore, in order to achieve the above-described object, in the manufacturing method for a piezoelectric resonator plate according to the present invention, the piezoelectric resonator plate is configured such that a vibration portion and a joining portion are provided in a substrate having a main face formed in a rectangular shape, the vibration portion including a vibration region configured by forming a pair of excitation electrodes, the joining portion having formed therein a pair of terminal electrodes that is joined to an external portion, the terminal electrodes in the pair each having a conductive bump formed therein and being electrically connected respectively to the excitation electrodes in the pair, and the substrate including a post portion formed convexly at a position where the pair of terminal electrodes is formed. The method includes a terminal-electrode forming step of forming the pair of terminal electrodes, a post-portion forming step of forming the post portion, and a conductive-bump forming step of forming the conductive bump, wherein the post-portion forming step and the conductive-bump forming step are performed during the terminal-electrode forming step.

According to the present invention, the terminal electrodes that contain the conductive bump and the post portion can be formed because the method includes the terminal-electrode forming step, the post-portion forming step and the conductive-bump forming step, and the post-portion forming step and the conductive-bump forming step are performed during the terminal-electrode forming step. From this, according to the present invention, the height of the conductive bump for joining with the external portion can be reduced, and accordingly variations in the height dimension and shape of the bumps, which may occur due to the increased height of the bumps, can be suppressed. In particular, the surface of the pair of terminal electrodes can be flattened. As a result, it is possible to stabilize the joining (installation) of the piezoelectric resonator plate to the external portion. In addition, the formation of the post portion makes it possible to suppress the height of the bumps and accordingly reduce the volume of the bumps, thereby suppressing the manufacturing cost.

Effects of the Invention

With the piezoelectric resonator plate and the manufacturing method for a piezoelectric resonator plate according to the present invention, it is possible to suppress variations in the height dimension and shape of the bumps.

MODE FOR CARRYING OUT THE INVENTION

Following is a description of embodiments of the present invention with reference to the drawings. Note that the following description of the embodiments takes the example of the case where the present invention is applied to a crystal resonator as a piezoelectric resonator.

Embodiment 1

Figure 1:
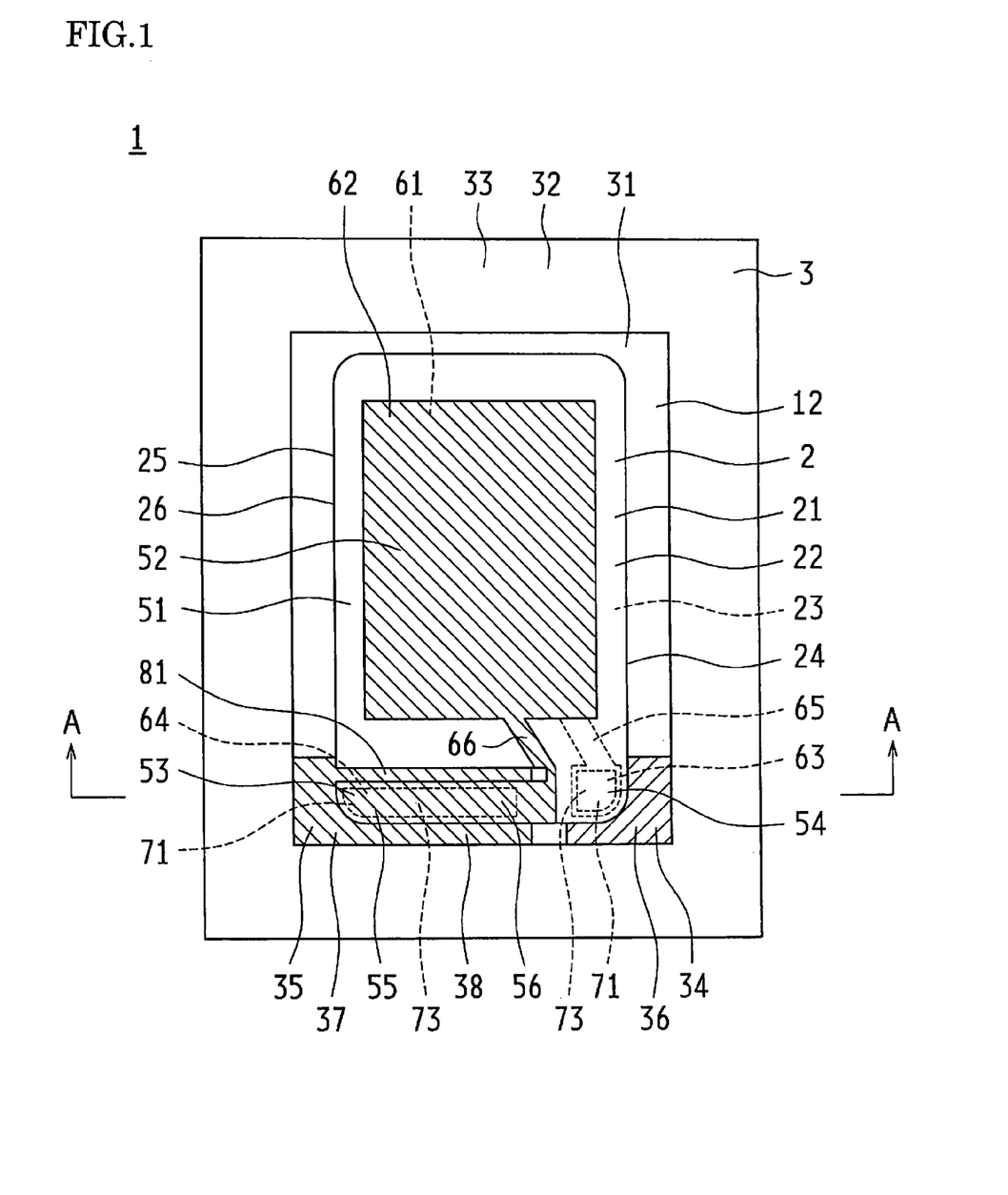
FIG. 1 is a schematic plan view showing an internal space of a crystal resonator according to Embodiment 1 of the present invention.
Figure 2:
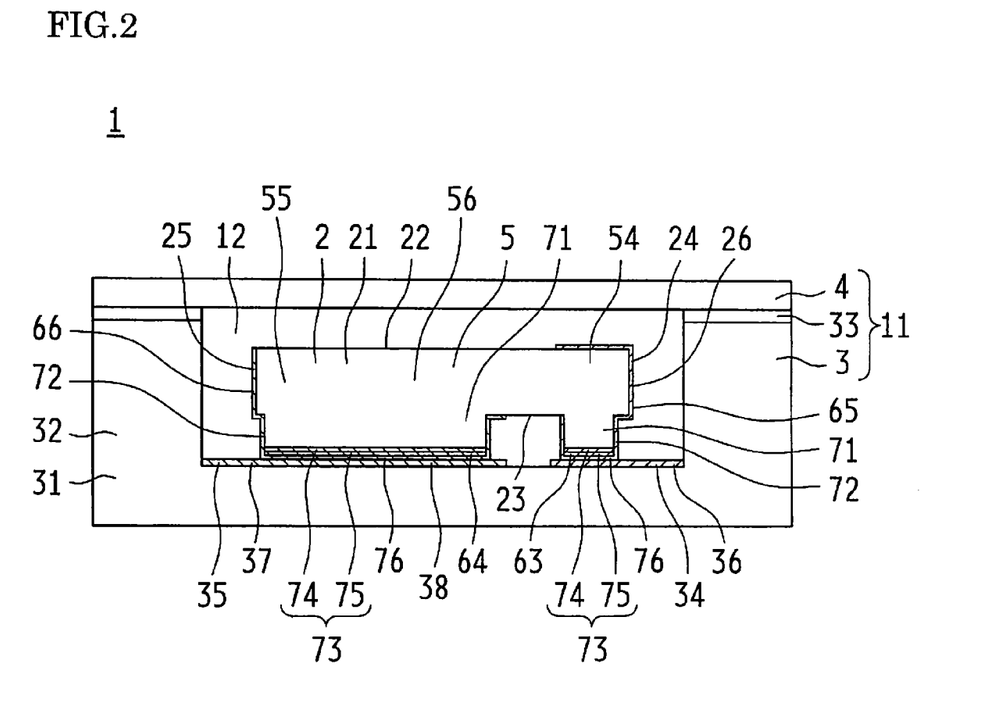
FIG. 2 is an end view taken along line A-A in FIG. 1.
Figure 3:
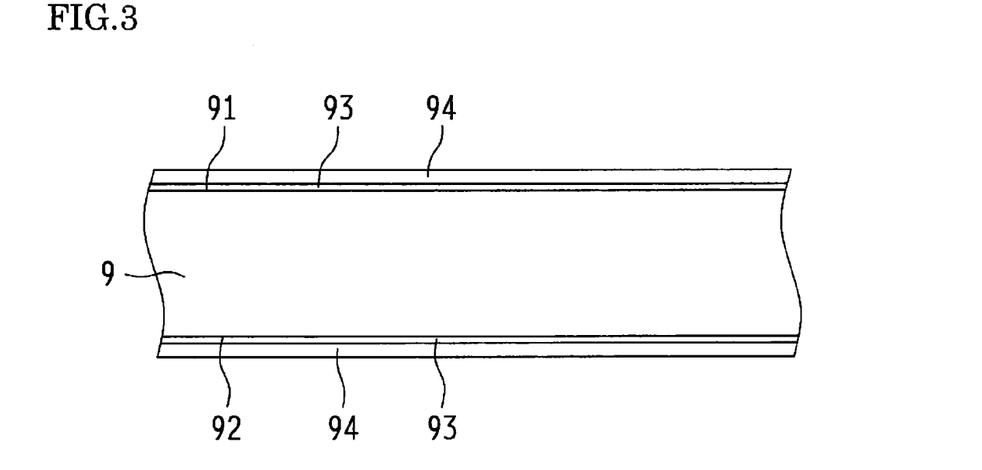
FIG. 3 is a flowchart showing the step of forming a resist layer on a substrate, which is one of the manufacturing steps for the crystal resonator plate according to Embodiment 1.
Figure 4:
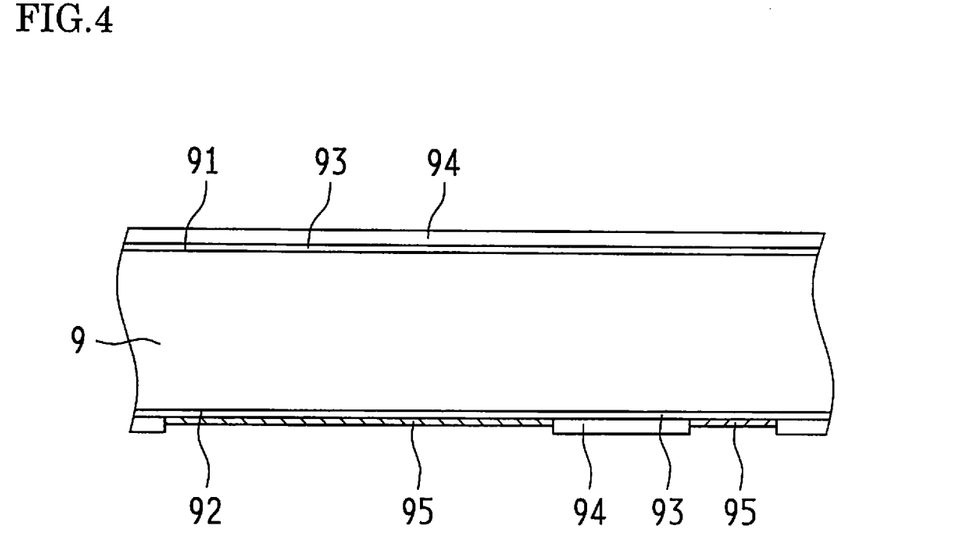
FIG. 4 is a flowchart showing the step of forming a gold plating on the substrate, which is one of the manufacturing steps for the crystal resonator plate according to Embodiment 1.
Figure 5:
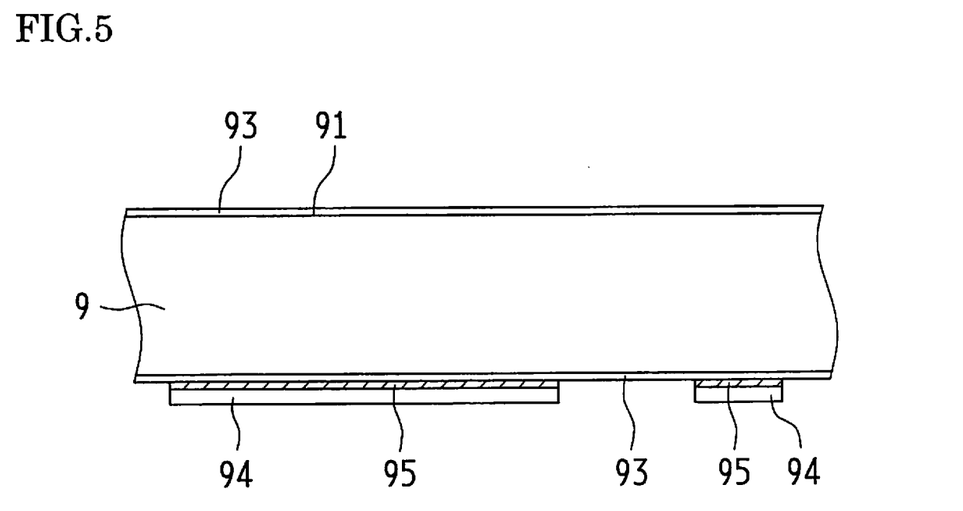
FIG. 5 is a flowchart showing the step of removing the resist layer from the substrate, which is one of the manufacturing steps for the crystal resonator plate according to Embodiment 1.

As shown in FIGS. 1 and 2, a crystal resonator 1 according to Embodiment 1 of the present invention is configured by a crystal resonator plate 2 made of AT-cut crystal (a piezoelectric resonator plate according to the present invention), a base 3 on which the crystal resonator plate 2 is held, and a lid 4 that hermetically seals the crystal resonator plate 2 held on the base 3.

With this crystal resonator 1, a package 11 is made up of the base 3 and the lid 4, and an internal space 12 of the package 11 is formed by joining the base 3 and the lid 4 to each other. The crystal resonator plate 2 is held on the base 3 in the internal space 12 of the package 11, and the internal space 12 of the package 11 is hermetically sealed. At this time, as shown in FIGS. 1 and 2, the crystal resonator plate 2 is electromechanically joined to the base 3 by ultrasonic bonding using the FCB (Flip Chip Bonding) method using conductive bumps 73 made of metal plating.

Next is a description of the constituent elements of the crystal resonator 1 with reference to FIGS. 1 and 2.

As shown in FIGS. 1 and 2, the base 3 is formed in a box-like shape made up of a bottom portion 31 and a wall portion 32 that extends upward from the bottom portion 31. The base 3 is configured by laminating a ceramic material of a rectangular parallelepiped shape on a single plate of ceramic material that is rectangular in plan view, and integrally firing those ceramic materials in a recessed shape. The dimensions of the base 3 in plan view are set to 3.2 mm×2.5 mm or less. Note that in Embodiment 1, the base 3 whose dimensions in plan view are set to 1.6 mm×1.2 mm or less is used.

The wall portion 32 of the base 3 is formed along the outer periphery of the front face of the bottom portion 31. The upper face of the wall portion 32 is the region that joins with the lid 4, and a metallization layer 33 for joining with the lid 4 (an example configuration is such that first nickel and then gold are plated on a tungsten metallization layer) is provided on this joining region.

Two electrode pads 36 and 37 that electromechanically join respectively with excitation electrodes 61 and 62 of the crystal resonator plate 2 are formed on the opposing corner portions (one corner portion 34 and the other corner portion 35) of the bottom portion 31 of the base 3 (cavity) within the internal space 12. The area of the electrode pad 37 formed on the other corner portion 35 is larger than that of the electrode pad 36 formed on the one corner portion 34. Specifically, the electrode pad 36 is formed on only the one corner portion 34, whereas the electrode pad 37 is formed extending from the other corner portion 35 toward a central portion 38. Those electrode pads 36 and 37 are electromechanically joined to external terminal electrodes (not shown) formed on the outer periphery of the rear face of the base 3, and are connected to an external component or an external device via the external terminal electrodes. Note that those external terminal electrodes and the electrode pads 36 and 37 are formed by printing a metallization material, such as tungsten or molybdenum, and firing the metallization material integrally with the base 3. Some of the external terminal electrodes and the electrode pads 36 and 37 are configured by forming a nickel plating on the top of the metallization and forming a gold plating on the nickel plating. Note that example methods of the plating as used herein include electrolytic plating and electroless plating, and the same applies to the method of plating discussed below.

As shown in FIG. 2, the lid 4 is formed as a single plate that is rectangular in plan view. The lid 4 has a brazing filler metal (not shown) formed on its underside. The lid 4 is joined to the base 3 using the brazing filler metal or the metallization layer 33 by metal brazing, seam welding, beam welding, or another such process, so as to configure the package 11 of the crystal resonator 1 from the lid 4 and the base 3. The dimensions of the lid 4 in plan view are set to 3.2 mm×2.5 mm or less. Note that in Embodiment 1, the substrate whose dimensions in plan view are set to 1.6 mm×1.2 mm is used.

The lid 4 is made up of four layers of metal materials having different thermal expansion coefficients. Specifically, first a gold tin brazing layer, which is a brazing filler metal, then a nickel layer, then a Koval layer (base material), and then another nickel layer are laminated from the underside of the lid 4, which is to be the face that joins with the base 3. Because the gold tin brazing layer and the nickel layer are on the underside of the lid 4, thermal joining to the base 3, which is made of ceramic, is easier than in the case where the other layers are on the underside. In addition, because the Koval layer is laminated over the gold tin brazing layer and the nickel layer, the lid 4 and the base 3 of ceramic can have approximately the same thermal expansion coefficient and accordingly undergo an equivalent level of thermal deformation. Note that the thickness of the Koval layer is designed to be as thick as possible in order to attain the equivalent level of thermal deformation. In the case of joining the lid 4 to the base 3, since the lid 4 is formed by laminating first the gold tin brazing layer, then the nickel layer, then the Koval layer, and then another nickel layer, the internal space 12 is hermetically sealed by melting the gold tin brazing layer in a heating furnace in an inert-gas or vacuum atmosphere.

The crystal resonator plate 2 is configured by a substrate 21 made of a piece of AT-cut crystal, and as shown in FIGS. 1 and 2, its outer shape is a single plate of a rectangular parallelepiped shape that is rectangular in plan view (both main faces 22 and 23 are formed in an approximately rectangular shape). Note that in Embodiment 1, the opposing long sides of the crystal resonator plate 2 in plan view are referred to as one side 24 and the other side 25. In Embodiment 1, the substrate 21 whose main face dimensions are set to 1.1 mm×0.7 mm and whose thickness dimension is set to 30 μm is used. Note that an approximately rectangular shape as referred to in the present embodiment is intended as a conceptual shape and is not limited to a precise rectangular shape, so it includes possible shaping errors. Accordingly, an approximately rectangular shape as referred to in the present embodiment denotes a shape that corresponds to a rectangular shape.

The crystal resonator plate 2 is provided with a vibration portion 51 that includes a vibration region 52, and a joining portion 53 that joins with the electrode pads 36 and 37 of the base 3 (an external portion according to the present invention), which are the external electrodes. The substrate 21 is configured by forming the vibration portion 51 and the joining portion 53 integrally with each other.

The pair of excitation electrodes 61 and 62 that performs excitation is formed in the vibration portion 51 of the crystal resonator plate 2. A pair of terminal electrodes 63 and 64 that is electromechanically joined to the electrode pads 36 and 37 of the base 3 is formed in the joining portion 53. Also, extraction electrodes 65 and 66 that extract the pair of excitation electrodes 61 and 62 to the pair of terminal electrodes 63 and 64 are formed in the vibration portion 51 and the joining portion 53. In the crystal resonator plate 2, the pair of excitation electrodes 61 and 62 is led by the extraction electrodes 65 and 66 and electrically connected to the pair of terminal electrodes 63 and 64.

The excitation electrodes 61 and 62 in the pair are formed, so as to oppose to each other, in the center of the vibration portion 51 in plan view on both of the main faces 22 and 23 of the substrate 21. The pair of excitation electrodes 61 and 62 is configured using, for example, a Cr—Au film that is formed by laminating first chromium and then gold from the substrate 21 side. The thickness dimension of the pair of excitation electrodes 61 and 62 is set within the range of 0.1 to 0.5 μm, and in Embodiment 1, the thickness dimension of the pair of excitation electrodes 61 and 62 is 0.3 μm.

The extraction electrodes 65 and 66 are formed, without opposing each other, on the main faces 22 and 23 and a side face 26 of the substrate 21 across the vibration portion 51 and the joining portion 53. Those extraction electrodes 65 and 66 are formed in the same manner as the excitation electrodes 61 and 62, that is, they are configured using a Cr—Au film that is formed by laminating first chromium and then gold from the substrate 21 side. The thickness dimension of the extraction electrodes 65 and 66 is set within the range of 0.05 to 0.5 μm, and in Embodiment 1, the thickness dimension of the extraction electrodes 65 and 66 is 0.3 μm.

The terminal electrodes 63 and 64 in the pair are formed on the other main face 23 in the joining portion 53. Specifically, of the pair of terminal electrodes 63 and 64, the one terminal electrode 63 is formed on one edge portion 54 of the opposing edge portions 54 and 55 of the joining portion 53, at one side 24 of the opposing sides 24 and 25 of the substrate 21. The other terminal electrode 64 is formed extending from a central portion 56 of the joining portion 53 to the other edge portion 55.

The pair of terminal electrodes 63 and 64 is configured by a post portion 71, a conductive bump 73, and a metal portion 76, in which the conductive bump 73 is formed on the post portion 71 and the metal portion 76 is formed on the conductive bump 73. With the substrate 21 viewed in side or plan view as shown in FIGS. 1 and 2, the post portion 71 and the conductive bump 73 at the pair of terminal electrodes 63 and 64 are arranged on the inner side of (i.e., contained in) the pair of the terminal electrodes 63 and 64. In other words, the outermost side (surface) of the pair of terminal electrodes 63 and 64 is configured by the metal portion 76, and the conductive bump 73 is formed on the post portion 71 so as to be contained by the metal portion 76. From this, the post portion 71 and the conductive bump 73 have dimensions slightly smaller than the pair of terminal electrodes 63 and 64.

The post portion 71 is formed by etching crystal, which is the material for the substrate 21, such that the substrate 21 is formed into a raised shape at the position where the pair of terminal electrodes 63 and 64 is formed (that is, one edge portion 54, and the region from the central portion 56 to the other edge portion 55, on the other main face 23 of the joining portion 53). The wall 72 of the post portion 71 extends in the vertical direction relative to the other main face 23 of the substrate 21 (that is, the direction orthogonal to the main face 23).

The conductive bump 73 is a plating bump made of a non-flowable material, and is configured by a Cr—Au film 74 formed by laminating first chromium and then gold on the post portion 71, and a gold plating 75 laminated on the Cr—Au film 74. As shown in FIG. 2, the conductive bump 73 is thicker than the metal portion 76 (the excitation electrodes 61 and 62 and the extraction electrodes 65 and 66) and thinner than the post portion 71.

The metal portion 76 forms the surface of the pair of terminal electrodes 63 and 64, is made of the same material, i.e., a Cr—Au film, as the excitation electrodes 61 and 62 and the extraction electrodes 65 and 66, is formed continuous with the extraction electrodes 65 and 66, and covers the post portion 71 and the conductive bump 73 as shown in FIGS. 1 and 2. Note that in Embodiment 1, the layer of chromium is 40 nm thick and the layer of gold is 150 nm thick.

Of the pair of terminal electrodes 63 and 64, the terminal electrode that is further from the vibration portion 51 on the substrate 21 is larger than the terminal electrode that is closer to the vibration portion 51 on the substrate 21. Note that whether or not each terminal electrode is further from the vibration portion 51 on the substrate 21 relates to the entire lengths of the extraction electrodes 65 and 66 that are extracted from the excitation electrodes 61 and 62 in the vibration portion 51 to the terminal electrodes 63 and 64. Specifically, in Embodiment 1, the entire length of the extraction electrode 66 is longer than that of the extraction electrode 65, and accordingly the terminal electrode 64 is larger than the terminal electrode 63.

Furthermore, the thickness of the post portion 71 at the pair of terminal electrodes 63 and 64 is at least three times that of the other portions (in Embodiment 1, the conductive bump 73 and the metal portion 76). Note that if the thickness of the post portion 71 is set to less than three times that of the other portions, the conductive bump 73 needs to be thickened (heightened), and in this case, the flatness of the surface of the pair of terminal electrodes 63 and 64 is reduced. On the other hand, if the thickness of the post portion 71 is set to more than ten times that of the other portions, the aspect ratio of the post portion 71 is increased and accordingly the post portion 71 is weakened. For this reason, it is preferable that the thickness of the post portion 71 is set to three to ten times that of the other portions.

The thickness dimension of the above-described pair of terminal electrodes 63 and 64 is set within the range of 2.5 to 25 μm, among which the thickness dimension of the post portion 71 is set within the range of 2 to 20 μm and a total thickness dimension of the conductive bump 73 and the metal portion 76 is set within the range of 0.5 to 5 μm. In Embodiment 1, the thickness of the post portion 71 is 8 μm, and a total thickness of the conductive bump 73 and the metal portion 76 is 2 μm. Furthermore, the aspect ratio of the post portion 71 formed on one edge portion 54 is 0.1, where the diameter (width) is 100 μm and the height is 10 μm. Note that the reliability of joining by the FCB method can be improved if the total thickness dimension of the conductive bump 73 and the metal portion 76 is 1 μm or more, so the total thickness dimension of the conductive bump 73 and the metal portion 76 shown in Embodiment 1 is a favorable example.

The crystal resonator plate 2 is further provided with a blocking means for, in the case where the pair of terminal electrodes 63 and 64 is electromechanically joined to the electrode pads 36 and 37 of the base 3, blocking the spread of joint stress occurring in the substrate 21 to the vibration region 52. Assuming that the vibration region 52 is located on a virtual orthogonal line that is orthogonal to a virtual line that connects the pair of terminal electrodes 63 and 64, the blocking means is provided on the virtual orthogonal line between the vibration portion 51 and the joining portion 53.

Specifically, the blocking means is configured by a cut-out portion 81 that is provided between the vibration portion 51 and the joining portion 53 and formed by cutting out the substrate 21 toward one side 24 from the other side 25. In the presence of this cut-out portion 81, the vibration portion 51 and the joining portion 53 are integrally formed with each other in only the vicinity of one edge portion 54 of the joining portion 53 where one terminal electrode 63 is formed. In other words, the vibration portion 51 and the joining portion 53 are continuous with each other at one edge portion 54 of the joining portion 53.

In the crystal resonator 1 with the above-described configuration, as shown in FIG. 1, the base 3 and the crystal resonator plate 2 are electromechanically joined to each other by ultrasonic bonding using the FCB method via the conductive bumps 73, which are one of the constituent elements of the pair of terminal electrodes 63 and 64. With this joining, the excitation electrodes 61 and 62 of the crystal resonator plate 2 are electromechanically joined to the electrode pads 36 and 37 of the base 3 via the extraction electrodes 65 and 66, the terminal electrodes 63 and 64, and the conductive bumps 73. Then, the crystal resonator plate 2 is hermetically sealed by joining the lid 4 to the base 3 to which the crystal resonator plate 2 has been joined, which as a result constitutes the crystal resonator 1.

Next is a description of a manufacturing method for the above-described crystal resonator plate 2 with reference to FIGS. 3 to 8.

First, a piece of AT-cut crystal, which is to be the substrate 21, is formed from a crystal ingot (not shown). Specifically, a Cr—Au film 93 is formed by laminating first chromium and then gold by sputtering on both main faces 91 and 92 of a wafer 9, which is formed from a crystal ingot and can be divided into a plurality of substrates 21. After the Cr—Au film 93 has been formed on both of the main faces 91 and 92 of the wafer 9, a resist layer 94 is formed on the Cr—Au film 93 (see FIG. 3).

After the resist layer 94 has been formed on the Cr—Au film 93, the resist layer 94 is removed from the positions where the conductive bumps 73 of the pair of terminal electrodes 61 and 62 are to be formed, and the Cr—Au film 93 is exposed at those positions. Then, a gold plating 95 is formed on the exposed Cr—Au film 93 (see FIG. 4). At this time, if the holes that have been formed by the removal of the resist layer 94 and in which the gold plating 95 is formed have a high aspect ratio of diameter to depth, variations will occur in the deposition rate of the plating (related to the thickness of the plating) and the shape of the plating because a new plating solution does not readily spread around the holes.

After the gold plating 95 has been formed on the Cr—Au film 93, the resist layer 94 is entirely removed, and another resist layer 94 is formed on both of the main faces 91 and 92 of the wafer 9. After the formation of the resist layer 94, only the resist layer 94 that has been formed directly on one main face 91 of the wafer 9 and on the Cr—Au film 93 is removed, so only the resist layer 94 formed on the gold plating 95 remains. At this time, portions of the Cr—Au film 93 on which the gold plating 95 has not been laminated are exposed (see FIG. 5).

Figure 6:
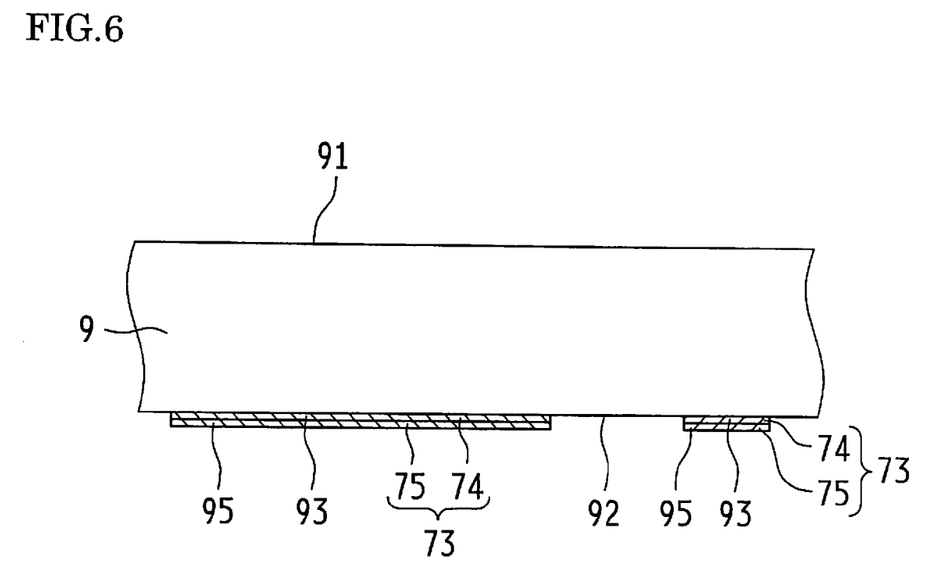
FIG. 6 is a flowchart showing the step of removing a Cr—Au film that is exposed on the substrate, which is one of the manufacturing steps for the crystal resonator plate according to Embodiment 1.
Figure 7:
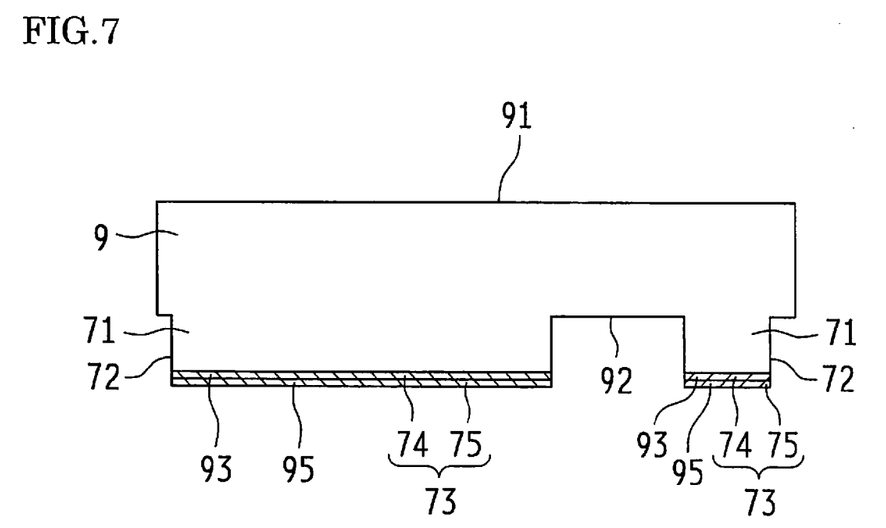
FIG. 7 is a flowchart showing the step of forming post portions of the substrate, which is one of the manufacturing steps for the crystal resonator plate according to Embodiment 1.
Figure 8:
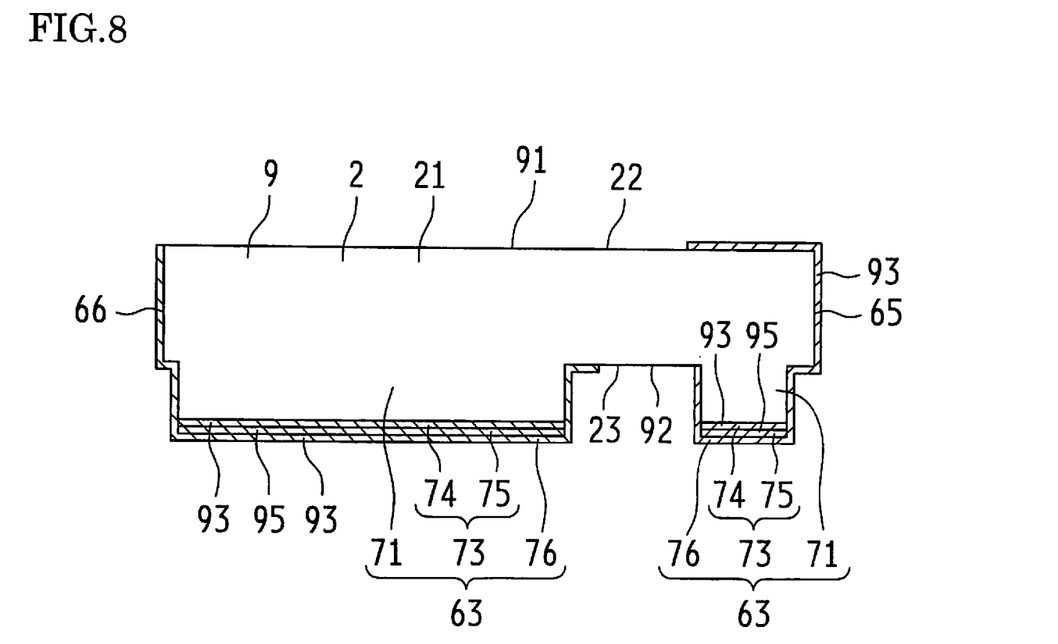
FIG. 8 is a flowchart showing the step of forming a pair of terminal electrodes on the substrate, which is one of the manufacturing steps for the crystal resonator plate according to Embodiment 1.

After the Cr—Au film 93 has been exposed, the exposed Cr—Au film 93 is removed by etching. Thereafter, the resist layer 94 formed on the gold plating 95 is removed so as to form the conductive bumps 73 made up of the Cr—Au film 74 and the gold plating 75 (the above step is referred to as a conductive-bump forming step in the present invention).

After the exposed Cr—Au film 93 has been removed by etching, portions of the substrate of the wafer 9 at which the exposed Cr—Au film 93 has been removed by etching are etched to a desired depth (in Embodiment 1, 8 μm) by crystal etching (see FIG. 7), and thereby the post portions 71 of the crystal resonator plates 2 are formed (the above step is referred to as a post-portion forming step in the present invention). Simultaneously with the post-portion forming step, the outer peripheral edge of the substrate 21 of the crystal resonator plate 2 and the cut-out portion 81 are also formed by etching (see FIG. 1). Note that the etching of the outer peripheral edge of the substrate 21 of the crystal resonator plate 2 and the cut-out portion 81 may be performed in another step from the post-portion forming step.

After the post portions 71 have been formed, a Cr—Au film (not shown) is formed by laminating first chromium and then gold on both of the main faces 91 and 92 of the wafer 9. After the formation of the Cr—Au film, a resist layer (not shown) is formed on the Cr—Au film.

After the resist layer has been formed on the Cr—Au film, the resist layer other than the portion of the electrode pattern for the pair of excitation electrodes 61 and 62 of the crystal resonator plate 2, the pair of terminal electrodes 63 and 64 and the extraction electrodes 65 and 66 is removed by photolithography, and the Cr—Au film that was exposed by this removal of the resist layer is removed by etching.

After the Cr—Au film has been removed by etching, the resist layer is removed, the pair of excitation electrodes 61 and 62, the metal portions 76 of the pair of terminal electrodes 63 and 64, and the extraction electrodes 65 and 66 are formed (see FIG. 8), and the pair of excitation electrodes 61 and 62, the pair of terminal electrodes 63 and 64, and the extraction electrodes 65 and 66 are formed, which are electrically connected to one another (the above step is referred to as a terminal-electrode forming step in the present invention). After the formation of the pair of excitation electrodes 61 and 62, the pair of terminal electrodes 63 and 64, and the extraction electrodes 65 and 66, a plurality of substrates 21 are formed by dividing the wafer 9, and a plurality of crystal resonator plates 2 are manufactured through subsequent desired manufacturing steps.

According to the crystal resonator plate 2 of Embodiment 1 described above, the substrate 21 is provided with the vibration portion 51 and the joining portion 53 that are integrated with each other, and the terminal electrodes 63 and 64 in the pair each have the conductive bump 73 formed therein and are electrically connected respectively to the excitation electrodes 61 and 62 in the pair. In other words, in the crystal resonator plate 2, the vibration portion 51 and the joining portion 53 are integrally formed with each other.

Furthermore, according to the crystal resonator plate 2 of Embodiment 1, the blocking means for, in the case where the pair of terminal electrodes 63 and 64 is joined to the electrode pads 36 and 37 of the base 3, which are external portions, via the conductive bump 73, blocking the spread of joint stress occurring in the substrate 21 to the vibration region 52 is provided between the vibration portion 51 and the joining portion 53. This suppresses the spread of the joint stress occurring in the substrate 21 during joining to the vibration region 52 even if the crystal resonator plate 2 is joined to the electrode pads 36 and 37 of the base 3 via the conductive bumps 73 that develop high joint stress. As a result, the joint strength can be increased without affecting the vibrations (oscillation frequency) of the crystal resonator plate 2.

Furthermore, according to the crystal resonator plate 2 of Embodiment 1 described above, the one terminal electrode 63 is formed on one edge portion 54 of the joining portion 53 at one side 24 of the substrate 21, the blocking means is configured by the cut-out portion 81 formed toward one side 24 from the other side 25 of the substrate 21, and the vibration portion 51 and the joining portion 53 are formed so as to be integrated with each other in only the vicinity of one edge portion 54 of the joining portion 53 where one terminal electrode 63 is formed. The cut-out portion 81 enables the joint stress occurring in the substrate 21 during joining to be confined within the joining portion 53 and thereby makes it possible to suppress the spread of the joint stress to the vibration region 52.

Furthermore, according to the crystal resonator plate 2 of Embodiment 1 described above, because the terminal electrode 64 that is further from the vibration portion 51 on the substrate 21 is larger than the terminal electrode 63 that is closer to the vibration portion 51 on the substrate 21, the electrical connection of the pair of terminal electrodes 63 and 64 to the electrode pads 36 and 37 of the base 3 can be established with stability, while increasing the strength of joining to the electrode pads 36 and 37 of the base 3 at the terminal electrode 64 that is further from the vibration portion 51.

Furthermore, according to the crystal resonator plate 2 of Embodiment 1 described above, because the conductive bumps 73 are plating bumps, the conductive bumps 73 do not spread (flow) during their joining to the electrode pads 36 and 37 of the base, and accordingly a short between the electrodes can be suppressed. In addition, the conductive bumps 73, which are plating bumps, can increase the joint strength.

Furthermore, according to the crystal resonator plate 2 of Embodiment 1 described above, because the substrate 21 includes the post portion 71 formed convexly at the position where the pair of terminal electrodes 63 and 64 has been formed, the height of the conductive bumps 73 for joining with the electrode pads 36 and 37 of the base 3 can be reduced, and accordingly variations in the height dimension and shape of the bumps, which may occur due to the increased height of the conductive bumps 73, can be suppressed. In particular, the surface of the pair of terminal electrodes 63 and 64 can be flattened. As a result, it is possible to stabilize the joining (installation) of the crystal resonator plate 2 to the electrode pads 36 and 37 of the base 3. In addition, the formation of the post portions 71 makes it possible to suppress the height of the conductive bumps 73 and accordingly reduce the volume of the conductive bumps 73, thereby suppressing the manufacturing cost.

Furthermore, according to the crystal resonator plate 2 of Embodiment 1 described above, because the conductive bump 73 is formed on the inner side of the pair of terminal electrodes 63 and 64, protrusion of the conductive bump 73 outside the pair of terminal electrodes 63 and 64 can be suppressed.

Furthermore, according to the crystal resonator plate 2 of Embodiment 1 described above, because the thickness of the post portion 71 at the pair of terminal electrodes 63 and 64 is at least three times that of the other portions, this is preferable for flattening the surface of the pair of terminal electrodes 63 and 64.

Furthermore, according to the crystal resonator plate 2 of Embodiment 1 described above, because the surface of the pair of terminal electrodes 63 and 64 is formed using the Cr—Au film 74, Au—Au joining is readily accomplished in the case where the electrode pads 36 and 37 of the base 3 is made of Au as in the present embodiment. In addition, since the film can be formed by sputtering even on the side face of the pair of terminal electrodes 63 and 64, the entire surface and side face of the pair of terminal electrodes 63 and 64 can be covered with the Cr—Au film. This will bring about an anchor effect in the portions where the film has been formed.

Furthermore, according to the manufacturing method for the crystal resonator plate 2 of Embodiment 1 described above, the terminal electrodes 63 and 64, each including the conductive bump 73 and the post portion 71, can be formed because the method includes the terminal-electrode forming step, the post-portion forming step and the conductive-bump forming step, and the post-portion forming step and the conductive-bump forming step are performed during the terminal-electrode forming step. From this, according to the present invention, the height of the conductive bumps 73 for joining with the electrode pads 36 and 37 of the base 3 can be reduced, and accordingly variations in the height dimension and shape of the bumps, which may occur due to the increased height of the conductive bumps 73, can be suppressed. In particular, the surface of the pair of terminal electrodes 63 and 64 can be flattened. As a result, it is possible to stabilize the joining (installation) of the crystal resonator plate 2 to the electrode pads 36 and 37 of the base 3. In addition, the formation of the post portions 71 makes it possible to suppress the height of the conductive bumps 73 and accordingly reduce the volume of the conductive bumps 73, thereby suppressing the manufacturing cost.

Note that although the crystal substrate 21 is used in Embodiment 1, this is merely a favorable example, and the present invention is not intended to be limited thereto. Alternatively, another material may be used as long as it is a piezoelectric material.

Furthermore, although the crystal resonator 1 in which the crystal resonator plate 2 is mounted on the base 3 is used in Embodiment 1, another piezoelectric oscillator in which another electronic component such as an IC chip is mounted may be used instead.

Furthermore, in Embodiment 1, although the flat-plate crystal resonator plate 2 is used as a target, this is merely a favorable example, and the present invention is not intended to be limited thereto. Instead, a high-frequency piezoelectric resonator plate may be used as a target. Alternatively, a fork piezoelectric resonator plate may be used as a target. Specifically, one example configuration of the high-frequency piezoelectric resonator plate is that a recessed portion is formed in the main face of the substrate of the piezoelectric resonator plate, and excitation electrodes are formed inside the recessed portion (reverse mesa structure).

Furthermore, in Embodiment 1, although the excitation electrodes 61 and 62 and the extraction electrodes 65 and 66 are configured using the Cr—Au film formed by laminating first chromium and then gold, the present invention is not intended to be limited thereto. For example, the Cr—Au film may be formed by laminating first chromium, then gold and then chromium (Cr—Au—Cr), or first gold and then nickel (Cr—Au—Ni), or first chromium, then silver and then chromium (Cr—Ag—Cr), or first chromium and then nickel (Cr—Ni), or first nickel and then chromium (Ni—Cr).

Furthermore, in Embodiment 1, although the lid 4 formed as a single plate of a rectangular parallelepiped shape that is rectangular in plan view and the base 3 formed in a recessed shape are used as shown in FIG. 1, the present invention is not intended to be limited thereto. The shapes of the base and the lid may be set arbitrarily as long as the crystal resonator plate 2 can be hermetically sealed with the base and the lid. For example, a base formed as a single plate of a rectangular parallelepiped shape that is rectangular in plan view and a lid formed in a recessed shape may be used instead.

Figure 9:
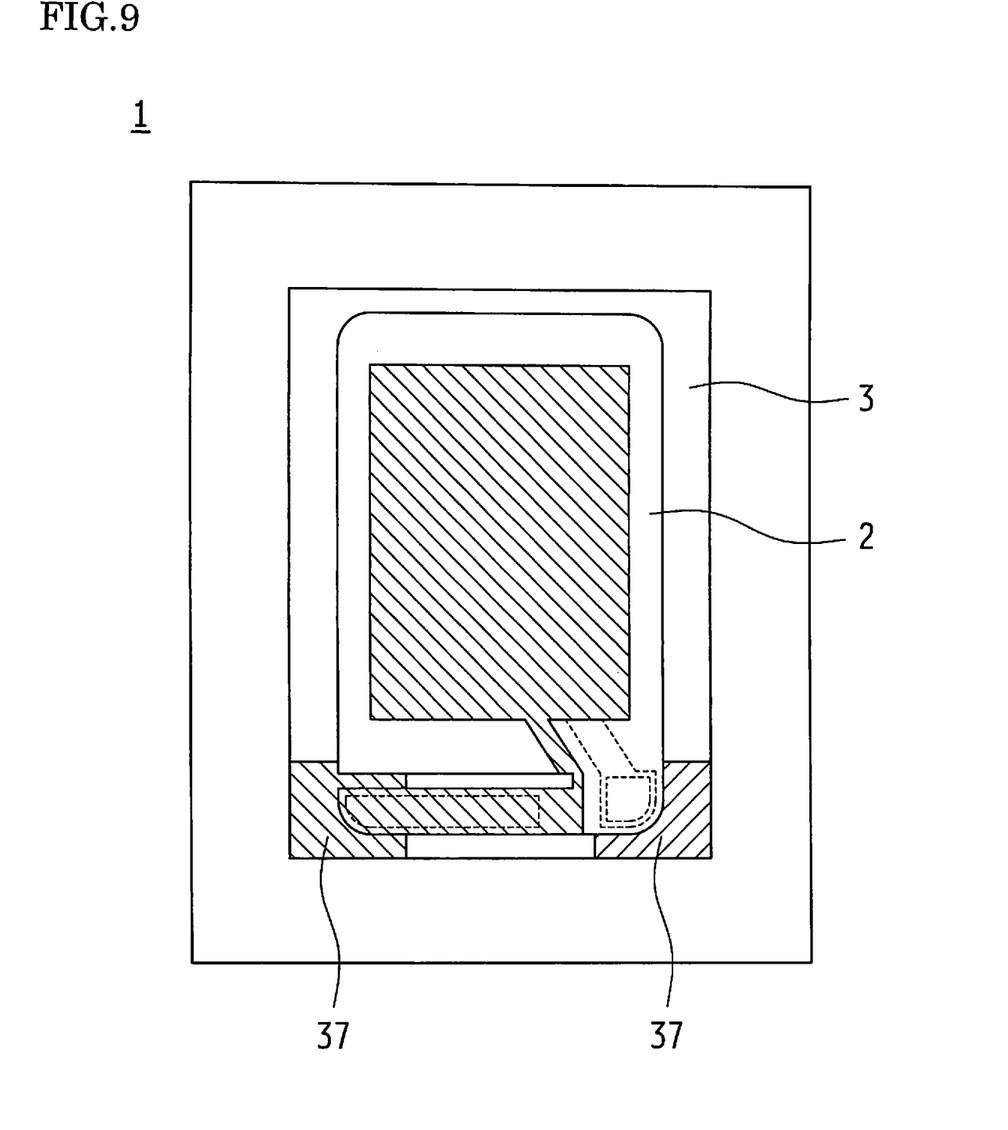
FIG. 9 is a schematic plan view showing an internal space of a crystal resonator according to another example of Embodiment 1.

Furthermore, in Embodiment 1, although the base 3 provided with the asymmetrical electrode pads 36 and 37 is used as shown in FIG. 1, this is merely a favorable example for favorable electrical connection, and the present invention is not intended to be limited thereto. Alternatively, a base 3 provided with symmetrical electrode pads 36 and 37 may be used as shown in FIG. 9.

Furthermore, in Embodiment 1, although the flat-plate crystal resonator plate 2 of a thickness-shear vibration type is used, the present invention is not intended to be limited thereto, and a high-frequency crystal resonator plate of a thickness-shear vibration type may be used instead. In the case of using the high-frequency crystal resonator plate of a thickness-shear vibration type, a reverse mesa structure is favorable in which a recessed portion is formed in the main face of the substrate and excitation electrodes are arranged inside the recessed portion.

Figure 10:
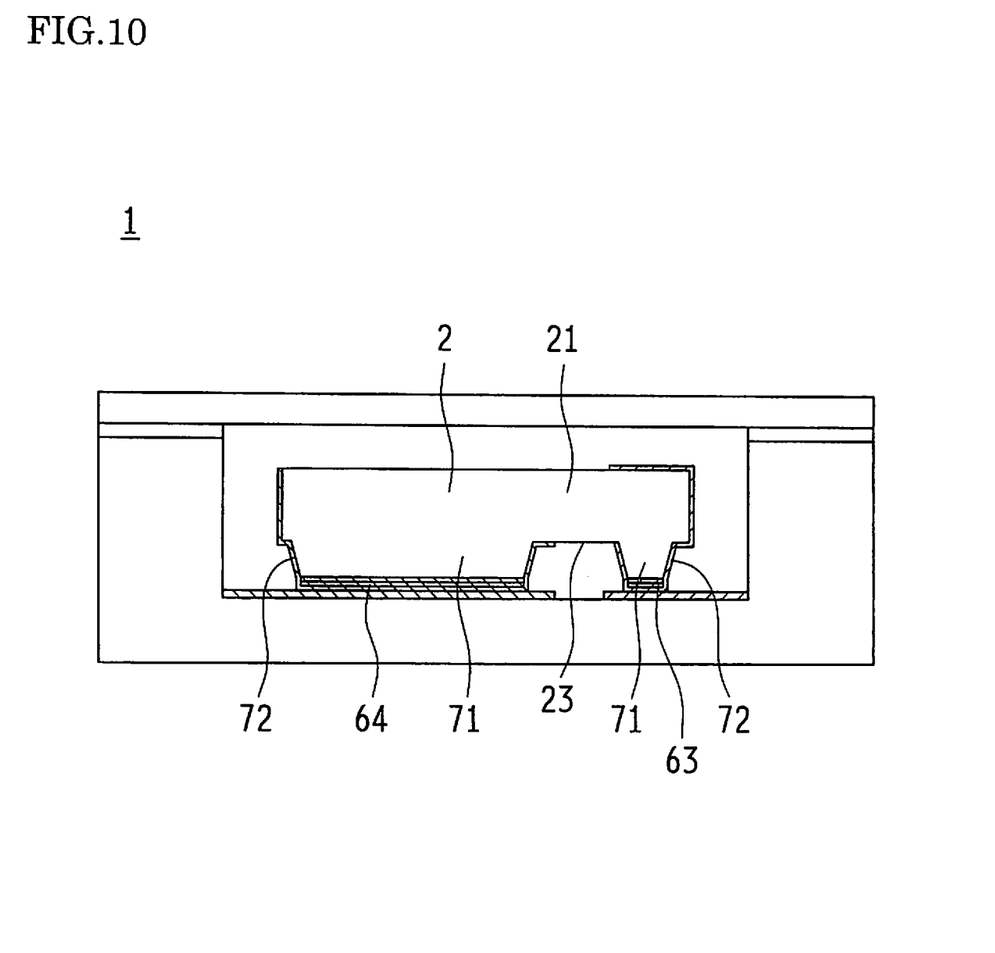
FIG. 10 is a schematic configuration diagram of the post portions according to another example of Embodiment 1.

Furthermore, in Embodiment 1, although the walls 72 of the post portions 71 extend in the vertical direction relative to the other main face 23 of the substrate 21, the present invention is not intended to be limited thereto, and as shown in FIG. 10, the walls 72 of the post portions 71 may be formed extending in an inclined and tapered configuration from the other main face 23 of the substrate 21. In other words, the walls 72 of the post portions 71 may have a tapered face. In this case, the strength of the post portions 71 can be increased. In addition, since the edges of the post portions 71 are eliminated, a disconnection of the pair of terminal electrodes 63 and 64 in the post portion 71 can be suppressed.

Furthermore, in Embodiment 1, although the brazing filler metal is a gold tin brazing layer, this is merely a favorable example, and the present invention is not intended to be limited thereto. Instead, the brazing filler metal may be a glass layer. In this case, the metallization layer 33 is not provided on the face that provides sealing between the base 3 of a ceramic material and the lid 4 (the upper face of the walls 32), and the brazing filler metal is formed on the outer periphery of the lower face of the lid 4, which is the face that joins with the base 3. Then, in the case of joining the lid 4 to the base 3, the internal space 12 is hermetically sealed by melting the brazing filler metal in a heating furnace in an inert-gas or vacuum atmosphere. In this case, the practical joint strength can be achieved while suppressing the manufacturing cost.

Furthermore, in Embodiment 1, although a ceramic material is used for the base 3, a glass material may be used for the base 3. In this case, a favorable configuration is such that the metallization layer 33 of the base 3 is formed by laminating a gold plating on a metal layer of chromium and gold (Cr—Au) that is formed by sputtering or vacuum evaporation. Note that the metallization layer 33 of the base 3 may be configured by, instead of laminating a gold plating on the metal layer of chromium and gold (Cr—Au), laminating a plating layer of nickel and gold on a metal layer of titanium and copper (Ti—Cu) or laminating a gold plating layer on a metal layer of molybdenum (or tungsten) and gold (Mo(W)—Au).

Embodiment 2

Next is a description of a crystal resonator according to Embodiment 2 of the present invention with reference to the drawing. Note that the crystal resonator according to Embodiment 2 is different in the shapes of the crystal resonator plate and the base from that of Embodiment 1 described above. The following description of Embodiment 2 focuses on different constituent elements from those of Embodiment 1 described above, and a description of the constituent elements that are the same as Embodiment 1 has been omitted. Accordingly, the effect of the same configuration, and modifications, are the same as those of Embodiment 1 described above.

Figure 11:
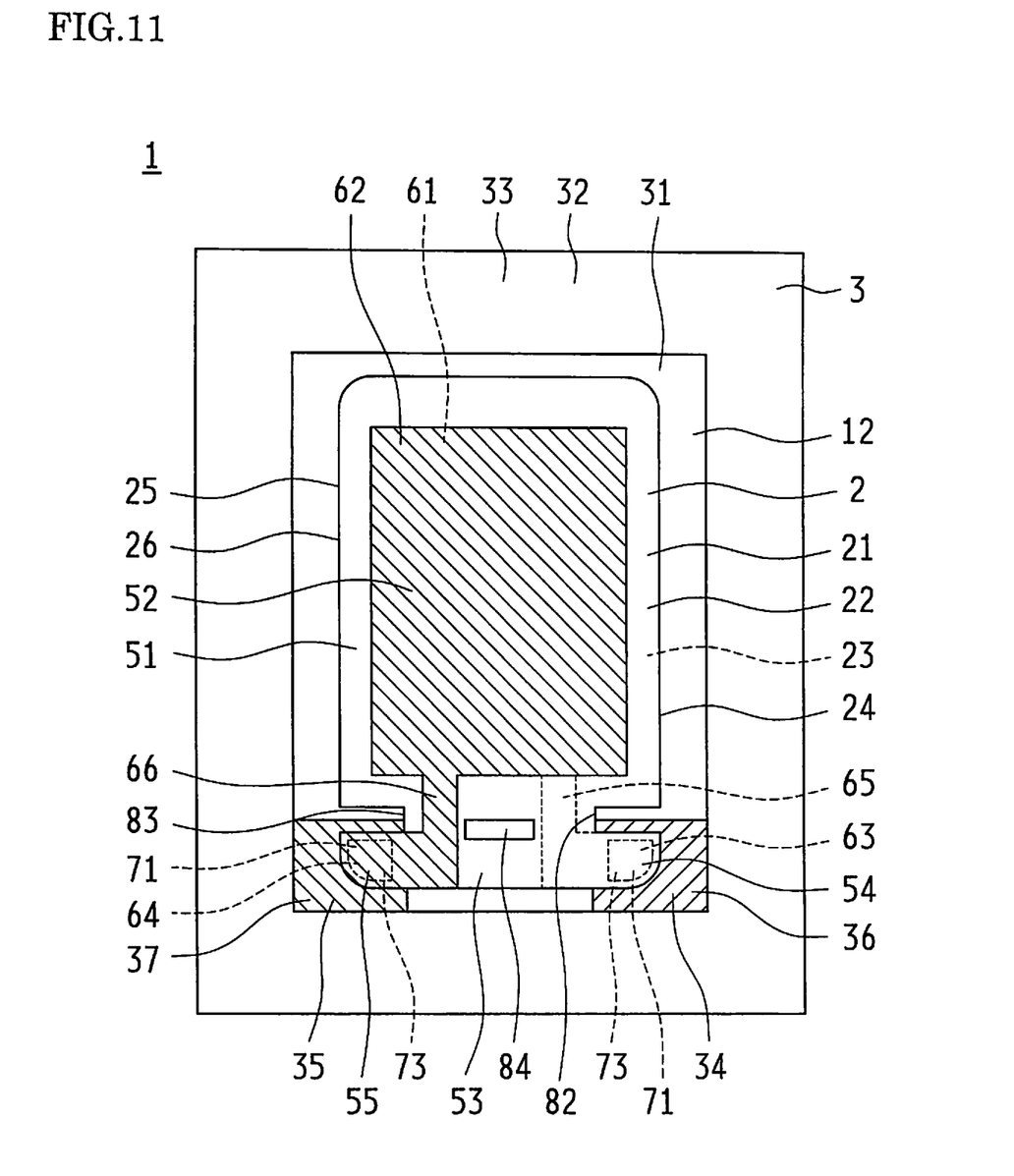
FIG. 11 is a schematic plan view showing an internal space of a crystal resonator according to Embodiment 2 of the present invention.

The crystal resonator 1 according to Embodiment 2 is provided with the crystal resonator plate 2, the base 3, and the lid 4 (not shown) as shown in FIG. 11.

Next is a description of the constituent elements of the crystal resonator 1.

The base 3 has the same configuration as that of another example of Embodiment 1 described above and shown in FIG. 9. Accordingly, a description thereof has been omitted here.

The lid 4 has the same configuration as that of Embodiment 1 described above and shown in FIG. 2. Accordingly, a description thereof has been omitted here.

In the crystal resonator plate 2, the pair of terminal electrodes 63 and 64, the extraction electrodes 65 and 66, and the blocking means are different in configuration from those of Embodiment 1 described above, and the other constituent elements have the same configuration as those of Embodiment 1. Accordingly, a description of the constituent elements that are the same as Embodiment 1 has been omitted.

The terminal electrodes 63 and 64 in the pair are formed on the other main face 23 of the joining portion 53. Specifically, of the pair of terminal electrodes 63 and 64, the one terminal electrode 63 is formed on one edge portion 54 of the opposing edge portions 54 and 55 of the joining portion 53 at one side 24 of the opposing sides of the substrate 21. The other terminal electrode 64 is formed on the other edge portion 55 of the joining portion 53 at the other side 25 of the substrate 21.

The thickness dimension of the above-described pair of terminal electrodes 63 and 64 is set within the range of 2 to 30 μm, among which the thickness dimension of the post portions 71 is set within the range of 1 to 19 μm, and the total thickness dimension of the conductive bumps 73 and the metal portions 76 is set within the range of 0.5 to 10 μm. Note that in Embodiment 2, the thickness of the post portions 71 is 8 μm, and the total thickness of the conductive bumps 73 and the metal portions 76 is 2 μm. Also, the aspect ratio of the post portion 71 of the pair of terminal electrodes 63 and 64 is 0.1.

The crystal resonator plate 2 is also provided with a blocking means for, in the case where the pair of terminal electrodes 63 and 64 is electromechanically joined to the electrode pads 36 and 37 of the base 3, blocking the spread of joint stress occurring in the substrate 21 to the vibration region 52. Assuming that the vibration region 52 is located on a virtual orthogonal line that is orthogonal to a virtual line that connects the pair of terminal electrodes 63 and 64, the blocking means is provided on the virtual orthogonal line between the vibration portion 51 and the joining portion 53.

As shown in FIG. 11, the blocking means is provided between the vibration portion 51 and the joining portion 53, and is configured by a cut-out portion 82 that is formed by cutting out the substrate 21 from one side 24 inwardly toward the other side 25, a cut-out portion 83 that is formed by cutting out the substrate 21 inward toward the one side 24 from the other side 25, and a through hole 84 that is formed between the cut-out portions 82 and 83. The cut-out portions 82 and 83 and the through hole 84 are formed along the virtual line. In the presence of the cut-out portions 82 and 83 and the through hole 84, the vibration portion 51 and the joining portion 53 are formed so as to be integrated with each other between the cut-out portion 82 and the through hole 84 and between the cut-out portion 83 and the through hole 84. In other words, the vibration portion 51 and the joining portion 53 are continuous with each other between the cut-out portion 82 and the through hole 84 and between the cut-out portion 83 and the through hole 84

In this crystal resonator plate 2, the electrode pattern of the extraction electrode 65 extracted from the excitation electrode 61 is formed between the cut-out portion 82 and the through hole 84 on one main face 22, and this extraction electrode 65 is electrically connected to the terminal electrode 63 formed on one edge portion 54 of the joining portion 53. Meanwhile, the electrode pattern of the extraction electrode 66 extracted from the excitation electrode 62 is formed between the cut-out portion 83 and the through hole 84 on the other main face 23, and this extraction electrode 66 is electrically connected to the terminal electrode 64 formed on the other edge portion 55 of the joining portion 53.

According to the crystal resonator plate 2 of Embodiment 2 described above, since it has the same configuration as that of Embodiment 1 described above, the effect of the same configuration as in Embodiment 1 can be achieved as in the crystal resonator 1 of Embodiment 1 described above.

Furthermore, according to the crystal resonator plate 2 of Embodiment 2 described above, the terminal electrodes 63 and 64 in the pair are formed respectively on both of the edge portions 54 and 55 of the joining portion 53 at the both of the sides 24 and 25 of the substrate 21, and the blocking means is configured by the two cut-out portions 82 and 83 formed inward respectively from both of the sides 24 and 25 of the substrate 21 and the through hole 84 formed between the cut-out portions 82 and 83. Accordingly, the two cut-out portions 82 and 83 and the through hole 84 enable the joint stress occurring in the substrate during joining to be confined within the joining portion 53 and thereby makes it possible to suppress the spread of the joint stress occurring in the substrate 21 to the vibration region. Specifically, in the presence of the two cut-out portions 82 and 83, although the joint stress concentrates between the two cut-out portions 82 and 83, the through hole 84 prevents the concentrated joint stress from propagating into the vibration region 52 and enables the joint stress to be confined within the joining portion 53.

Embodiment 3

Next is a description of a crystal resonator according to Embodiment 3 of the present invention with reference to the drawing. Note that the crystal resonator according to Embodiment 3 is different in the shapes of the crystal resonator plate and the base from those of Embodiments 1 and 2 described above. The following description of Embodiment 3 focuses on different constituent elements from those of Embodiments 1 and 2 described above, and a description of the constituent elements that are the same as Embodiments 1 and 2 has been omitted. Accordingly, the effect of the same configuration, and modifications, are the same as those of Embodiments 1 and 2 described above.

Figure 12:
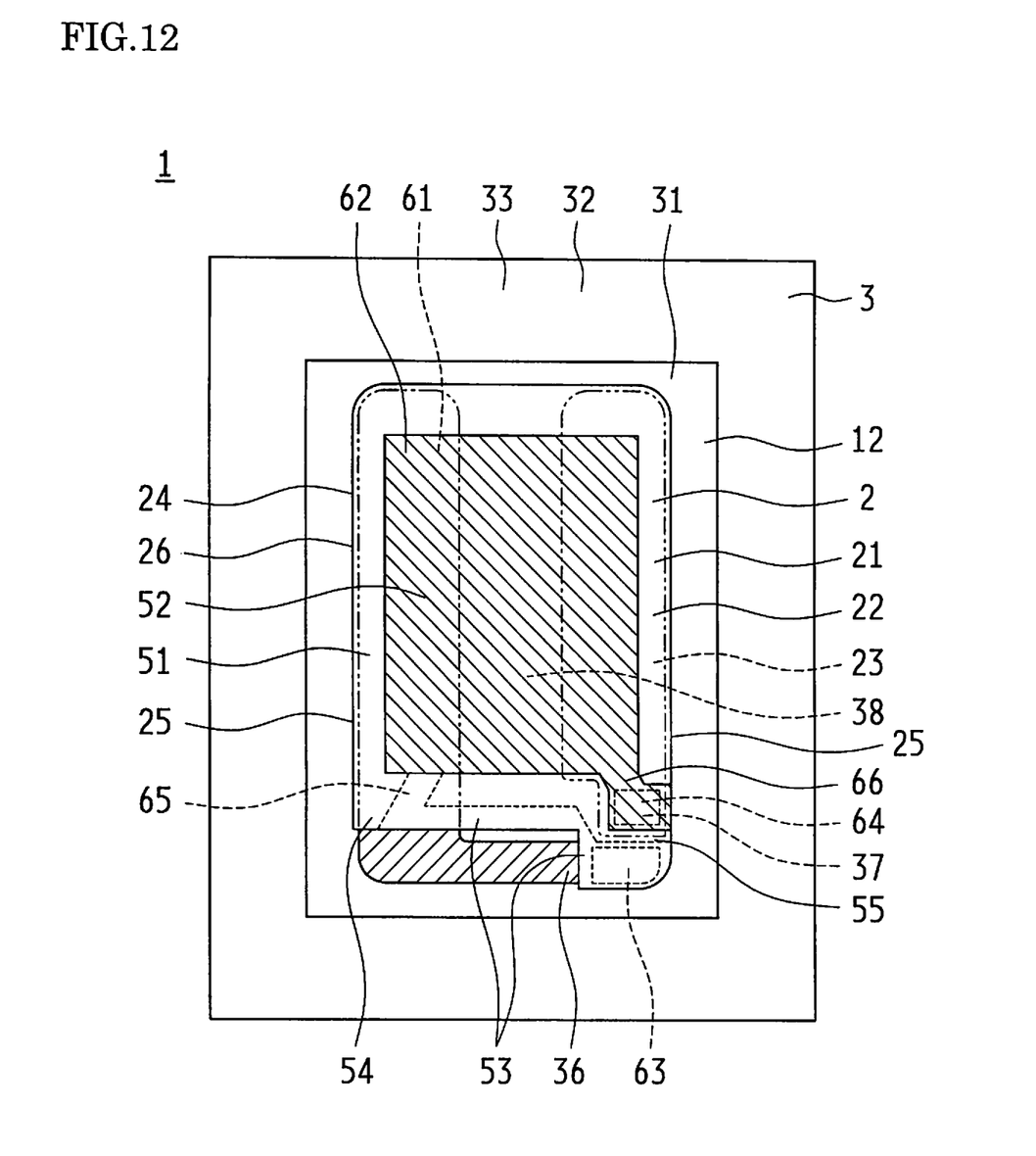
FIG. 12 is a schematic plan view showing an internal space of a crystal resonator according to Embodiment 3 of the present invention.

The crystal resonator 1 according to Embodiment 3 is provided with the crystal resonator plate 2, the base 3, and the lid 4 (not shown) as shown in FIG. 12.

Next is a description of the constituent elements of the crystal resonator 1.

In the crystal resonator plate 2, the joining portion 53, the pair of terminal electrodes 63 and 64, the extraction electrodes 65 and 66, and the blocking means are different in configuration from those of Embodiment 1 described above, and the other constituent elements have the same configuration as those of Embodiment 1. Accordingly, a description of the constituent elements that are the same as Embodiment 1 has been omitted.

The terminal electrodes 63 and 64 in the pair are formed on one main face 23 of the joining portion 53. Specifically, both of the terminal electrodes 63 and 64 in the pair are formed on one edge portion 55 of the opposing edge portions 54 and 55 of the joining portion 53 at one side 25 of the opposing sides 24 and 25 of the substrate 21.

The terminal electrodes 63 and 64 in the pair are formed in alignment with each other such that one of the terminal electrodes is further from the vibration portion 51 than the other terminal electrode. Whether each terminal electrode is further from or closer to the vibration portion 51 as referred to herein relates to whether the shortest straight-line distance from the vibration portion 51 is long or short. Furthermore, in Embodiment 3, the excitation electrodes 61 and 62 (vibration region) are located in a position other than on a virtual orthogonal line that is orthogonal to a virtual line that connects the pair of terminal electrodes 63 and 64.

Of the pair of terminal electrodes 63 and 64, the terminal electrode 63 that is further from the vibration portion 51 on the substrate 21 is larger than the terminal electrode 64 that is closer to the vibration portion 51 on the substrate 21. Whether or not each terminal electrode is further from the vibration portion 51 on the substrate 21 as referred to herein relates to the entire lengths of the extraction electrodes 65 and 66 that are extracted from the excitation electrodes 61 and 62 in the vibration portion 51 to the terminal electrodes 63 and 64. Specifically, in Embodiment 3, one terminal electrode 63 is larger than the other terminal electrode 64.

The thickness dimension of the above-described pair of terminal electrodes 63 and 64 is set within the range of 2 to 30 µm, among which the thickness dimension of the post portions 71 is set within the range of 1 to 19 µm and the total thickness dimension of the conductive bumps 73 and the metal portions 76 is set within the range of 0.5 to 10 µm. Note that in Embodiment 3, the thickness of the post portions 71 is 8 µm, and the total thickness of the conductive bumps 73 and the metal portions 76 is 2 µm. Also, the aspect ratio of the post portion 71 of the pair of terminal electrodes 63 and 64 is 0.1.

In the joining portion 53, among both of the edge portions 54 and 55, one edge portion 55 protrudes outward along the virtual line. Specifically, the joining portion 53 is formed in an L shape in plan view, and the terminal electrode 63 is formed on this protruding portion.

The base 3 is different in the electrode pads 36 and 37 from Embodiment 1 described above, and the other constituent elements have the same configuration as Embodiment 1. Accordingly, a description of the constituent elements that are the same as Embodiment 1 has been omitted.

Two electrode pads 36 and 37 that electromechanically join respectively with the excitation electrodes 61 and 62 of the crystal resonator plate 2 are formed on the bottom portion 31 of the base 3 (cavity) in the internal space 12. Note that in FIG. 12, portions of the two electrode pads 36 and 37 that are hidden behind the crystal resonator plate 2 are indicated by chain double-dashed lines.

Among those electrode pad 36,37, the area of the electrode pad 36 is larger than that of the electrode pad 37 in relation to how the electrode patterns run. Specifically, the electrode pad 37 is formed on only the right side of the central portion 38 in plan view, whereas the electrode pad 36 is formed on the left side of the central portion 38 in plan view and also extends toward the lower right side in plan view in correspondence with the position of the terminal electrode 63 of the crystal resonator plate 2. Those electrode pads 36 and 37 are patterned so as not to be superimposed on the terminal electrodes 63 and 64 and the extraction electrodes 65 and 66 of the crystal resonator plate 2 when the crystal resonator plate 2 is mounted on the base 3.

The lid 4 has the same configuration as that of Embodiments 1 and 2 described above and shown in FIG. 2. Accordingly, a description thereof has been omitted here.

According to the crystal resonator plate 2 of Embodiment 3 described above, since it has the same configuration as those of Embodiments 1 and 2 described above, the effect of the same configuration as Embodiments 1 and 2 can be achieved as in the crystal resonators 1 of Embodiments 1 and 2 described above.

Furthermore, according to the crystal resonator plate 2 of Embodiment 3 described above, the terminal electrodes 63 and 64 in the pair are formed on other edge portion 55 of the joining portion 53 at other side 25 of the substrate 21, and the vibration region is located in a position other than on the virtual orthogonal line that is orthogonal to the virtual line connecting the pair of terminal electrodes 63 and 64. Therefore, even if the crystal resonator plate 2 is joined to the electrode pads 36 and 37 of the base 3 via the conductive bumps 73 that develop high joint stress, it is possible to suppress the spread of joint stress occurring in the substrate 21 during joining, to the vibration region 52 because the joint stress occurs in a direction different from that toward the vibration region 52. As a result, the joint strength can be increased without affecting the vibrations (oscillation frequency) of the crystal resonator plate 2.

Furthermore, because the terminal electrodes 63 and 64 in the pair are formed in alignment with each other such that one of the terminal electrodes is further from the vibration portion than the other terminal electrode, a configuration is possible in which the spread of stress occurring between the conductive bumps 73 at the pair of terminal electrodes 63 and 64 (input and output) can be stopped on the conductive bump 73 side that is closer to the vibration region 52, and as a result, the vibration region 52 is not affected by the stress occurring between the conductive bumps 73.

The present invention can be reduced to practice in various other forms without departing from its spirit or essential features. For this reason, the above-described exemplary embodiments are to all intents and purposes merely illustrative and should not be construed as limiting. The scope of the present invention is defined by the claims and is not in any way restricted by the descriptions of the specification. Furthermore, all variations and modifications of the claims within the scope of equivalency fall within the scope of the present invention.

Also, this application claims prior right on the basis of Japanese Patent Applications Nos. 2009-217049 and 2009-217053 filed in Japan on Sep. 18, 2009, the content of which is hereby incorporated in its entirety by reference herein.

INDUSTRIAL APPLICABILITY

The present invention is preferable for a piezoelectric resonator plate using crystal as the material for a substrate.

DESCRIPTION OF REFERENCE NUMERALS

1 Crystal resonator
2 Crystal resonator plate
21 Substrate
22, 23 Main face
24 One side
25 Other side
36, 37 Electrode pad
51 Vibration portion
52 Vibration region
53 Joining portion
54 One edge portion
55 Other edge portion
56 Central portion
61, 62 Excitation electrode
63, 64 Terminal electrode
65, 66 Extraction electrode
71 Post portion
72 Wall
73 Conductive bump 74 Cr—Au film
75 Gold plating
76 Metal portion
81 Cut-out portion
82, 83 Cut-out portion
84 Through hole
9 Wafer
91, 92 Main face
93 Cr—Au film
94 Resist layer
95 Gold plating

The invention claimed is:

1. A piezoelectric resonator plate comprising a vibration portion and a joining portion that are integrally provided in a substrate having a main face formed in a rectangular shape, the vibration portion including a vibration region configured by forming a pair of excitation electrodes, the joining portion having formed therein a pair of terminal electrodes that is joined to an external portion,
  the terminal electrodes in the pair each have a conductive bump formed therein from a non-flowable material and are electrically connected respectively to the excitation electrodes in the pair, and
  the substrate includes a post portion formed convexly at a position where the pair of terminal electrodes is formed, and
  the conductive bumps are formed respectively on an inner side of the pair of terminal electrodes.

2. The piezoelectric resonator plate according to claim 1, wherein the thickness of the post portion at the pair of terminal electrodes is at least three times the thickness of other portions.

3. The piezoelectric resonator plate according to claim 1, wherein a wall of the post portion has a tapered face.

4. The piezoelectric resonator plate according to claim 1, wherein a surface of the pair of terminal electrodes is formed using a Cr—Au film.

5. The piezoelectric resonator plate according to claim 1, wherein a blocking means for, in the case where the pair of terminal electrodes is joined to the external portion via the conductive bump, blocking spread of joint stress occurring in the substrate to the vibration region is provided between the vibration portion and the joining portion.

6. The piezoelectric resonator plate according to claim 5, wherein
  one terminal electrode of the pair of terminal electrodes is formed on one of both end edge portions opposed of the joining portion,
  the blocking means is configured by a cut-out portion that is formed toward one side from the other side of both end sides opposed of the substrate, and
  the vibration portion and the joining portion are integrally formed in only the vicinity of the one edge portion of the joining portion where the one terminal electrode is formed.

7. The piezoelectric resonator plate according to claim 5, wherein
  the terminal electrodes in the pair are formed respectively on both edge portions of the joining portion at both end sides of the substrate, and
  the blocking means is configured by two cut-out portions that are formed inward respectively from both of the sides of the substrate, and a through hole that is formed between the two cut-out portions.

8. The piezoelectric resonator plate according to claim 1, wherein
  the terminal electrodes in the pair are formed on one of both end edge portions of the joining portion, and
  the excitation electrodes are located in a position other than on a virtual orthogonal line that is orthogonal to a virtual line that connects the pair of terminal electrodes.

9. The piezoelectric resonator plate according to claim 8, wherein the terminal electrodes in the pair are provided in alignment with each other such that of the terminal electrodes is further from the vibration portion than the other terminal electrode.

10. The piezoelectric resonator plate according to claim 1, wherein, one terminal electrode of the pair of terminal electrodes that is further from the vibration portion on the substrate is larger than the other terminal electrode that is closer to the vibration portion on the substrate.

11. The piezoelectric resonator plate according to claim 1, wherein the conductive bump is a plating bump.

12. A piezoelectric resonator plate comprising a vibration portion and a joining portion that are integrally provided in a substrate having a main face formed in a rectangular shape, the vibration portion including a vibration region configured by forming a pair of excitation electrodes, the joining portion having formed therein a of terminal electrodes that is joined to an external portion, wherein
  the terminal electrodes in the pair each have a conductive bump formed therein and are electrically connected respectively to the excitation electrodes in the pair,
  the substrate includes a post portion formed convexly at a position where the pair of terminal electrodes is formed,
  the conductive bump is each formed on an inner side of the pair of terminal electrodes, and
  each conductive bump is a plating bump.

13. A piezoelectric resonator plate according to claim 12, wherein each conductive bump is made from a non-flowable material.

14. A piezoelectric resonator plate according to claim 1, wherein each conductive bump is thicker than the metal portion of excitation electrodes and thinner than an adjacent post portion.

* * * * *